(12) United States Patent
Hendrickson et al.

(10) Patent No.: US 10,892,388 B2
(45) Date of Patent: Jan. 12, 2021

(54) GESN NANOBEAM LIGHT-EMITTING DIODE

(71) Applicant: Government of the United States, as represented by the Secretary of the Air Force, Wright-Patterson AFB, OH (US)

(72) Inventors: Joshua Hendrickson, Dayton, OH (US); Ricky D. Gibson, Jr., Hilliard, OH (US)

(73) Assignee: United States of America as represented by the Secretary of Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/385,655

(22) Filed: Apr. 16, 2019

(65) Prior Publication Data
US 2020/0098956 A1 Mar. 26, 2020

Related U.S. Application Data

(60) Provisional application No. 62/735,994, filed on Sep. 25, 2018.

(51) Int. Cl.
*H01L 33/58* (2010.01)
*H01L 33/20* (2010.01)
(Continued)

(52) U.S. Cl.
CPC .............. *H01L 33/58* (2013.01); *H01L 33/20* (2013.01); *H01L 33/34* (2013.01); *H01L 33/36* (2013.01)

(58) Field of Classification Search
CPC combination set(s) only.
See application file for complete search history.

(56) References Cited

U.S. PATENT DOCUMENTS

| 5,548,128 A * | 8/1996 | Soref .................... H01L 31/105 257/103 |
| 7,679,098 B2 | 3/2010 | Corzine |

(Continued)

FOREIGN PATENT DOCUMENTS

| JP | 2013089920 A | 5/2013 |
| JP | 2013127528 A | 6/2013 |

OTHER PUBLICATIONS

Aliaksandra Ivinskaya; Andrei Lavrinenko; Dzmitry M. Shyroki; Andrey A. Sukhorukov; Single and Coupled Nanobeam Cavities; Published in Advances in Photonic Crystals; Publication date 2013; Chapter 2; (25 pages).

(Continued)

*Primary Examiner* — Moazzam Hossain
(74) *Attorney, Agent, or Firm* — AFMCLO/JAZ

(57) ABSTRACT

An LED structure is formed in a nanobeam on a semiconductor base and includes three nanobeam sections. A central section is the LED and it is formed by a bottom germanium doped layer, a middle germanium-tin layer and a top germanium layer that is doped oppositely from the bottom germanium layer. Left and right germanium nanobeam sections extend outwardly from the left and right ends of the central section. Metal contacts are formed on the top and bottom layers and an electrical circuit is connected to the metal contacts and provides an electrical signal that energizes the middle section and causes it to emit light, some of which is transmitted by the left and right nanobeams. Cylindrical holes are formed in the nanobeam and are sized and spaced apart to form a zero point-defect resonator. The diameters of the holes are reduced as they move further away from the central section in accordance with a Gaussian taper. The LED is configured and dimensioned to have a maximum modulation rate from about 1.6 GHz to about 0.4 GHz. The bottom layer is configured such that the metal (Continued)

contact on the bottom layer is spaced away from the middle layer to thereby reduce metal damping of the LED.

1 Claim, 3 Drawing Sheets

(51) Int. Cl.
    *H01L 33/36*     (2010.01)
    *H01L 33/34*     (2010.01)

(56) References Cited

U.S. PATENT DOCUMENTS

| | | | |
|---|---|---|---|
| 7,907,848 B1* | 3/2011 | Soref | H04B 10/801 |
| | | | 359/244 |
| 8,798,414 B2* | 8/2014 | Quan | G02B 6/1225 |
| | | | 385/10 |
| 9,360,638 B2 | 6/2016 | Maetani et al. | |
| 9,595,812 B2 | 3/2017 | Nam et al. | |
| 2006/0071218 A1 | 4/2006 | Takeda et al. | |
| 2017/0336564 A1* | 11/2017 | Soref | G02F 1/3136 |
| 2018/0102442 A1 | 4/2018 | Wang et al. | |

OTHER PUBLICATIONS

Eli Yablonovitch; Light Emission in Photonic Crystal Micro-Cavities; UCLA Engineering Dept; Plenum Press, New York, 1995 (12 pages).

Erwin K. Lau; Amit Lakhani; Rodney S. Tucker; and Ming C. Wu; Enhanced Modulation Bandwidth of Nanocavity Light Emitting Devices; Optics Express 7790; May 11, 2009 Published Apr. 27, 2009; 10 pages.

Joshua Hendrickson; Richard Soref; Julian Sweet; and Walter Buchwald; Ultrasensitive silicon photonic-crystal nanobeam electro-optical modulator: Design and simulation; Optics Express 3271; vol. 22, No. 3, Feb. 10, 2014; published Feb. 4, 2014; (13 pages).

Michihiro Kuroki; Satoshi Kako; Satomi Ishida; Katsuya Oda; Tatemi Ido; Satoshi Iwamoto; and Yasuhiko Arakawa; Germanium Photonic Crystal Nanobeam Cavity with Q>1,300; Institute of Industrial Science and Institute for Nano Quantum Information electronics; CLEO:2015 Copyright 2015 (2 pages).

Milos Nedeljkovic;,Richard Soref; and Goran Z. Mashanovich; Predictions of Free-Carrier Electroabsorption and Electrorefraction in Germanium; IEEE Photonics Journal—An IEEE Photonics Society Publication; vol. 7, No. 3, Jun. 2015. (15 pages).

Qimin Quan; Parag B. Deotare; and Marko Loncar; Photonic Crystal Nanobeam Cavity Strongly Coupled to the Feeding Waveguide; Applied Physics Letter.96, 203102; Published online May 17, 2010. (4 pages).

Richard Soref; and Joshua Hendrickson; Proposed ultralow-energy dual photonic-crystal nanobeam devices for on-chip N×N switching, logic, and wavelength multiplexing; Optics Express, vol. 23, Issue 25, published 2015; (21 pages—32582-32596).

Richard Soref; Joshua R. Hendrickson; R. Shua; and Julian Sweet; Simulation of germanium nanobeam electro-optical 2×2 switches and 1×1 modulators for the 2 to 5 um infrared region; Optics Express 9369; vol. 24, No. 9; May 2, 2016, published Apr. 20, 2016, (14 pages).

S. Wirths; R. Geiger; N. Von Den Driesch; G. Mussler; T. Stoica; S. Mantl; Z. Ikonic; M. Luysberg; S. Chiussi; J.M. Hartmann; H. Sigg; J. Faist; D. Buca and D. Grutzmacher; Lasing in Direct-Bandgap GeSn Alloy Grown on Si; Nature Photonics; Published Online Jan. 19, 2015; (5 pages).

Stefano Dominici; Hangqing Wen; Francesco Bertazzi; Michele Goano; and Enrico Bellotti Numerical study on the optical and carrier recombination processes in GeSn alloy for E-SWIR and MWIR optoelectronic applications; Optics Express 26363, vol. 24, No. 23, Nov. 14, 2016; Published Nov. 7, 2016. (19 pages).

Steven G. Johnson; Shanhui Fan; Pierre R. Villeneuve; and J. DL Joannopoulos; Guided Modes in Photonic Crystal Slabs; vol. 60, No. 8; Aug. 15, 1999 (8 pages).

Wei Du; Seyed Ghetmiri; Sattar Al-Kabi; Aboozar Mosleh; Thach Pham; Yiyin Zhou; Huong Tran; Greg Sun; Richard Soref; Joe Margetis; John Tolle; Baohua Li; Mansour Mortazavi; Hameed Vaseem; Shui-Qing Yu; Silicon Based Ge0.89Sn0.11 Photodetector and Light Emitter Towards Mid-Infrared Applications; Proceedings vol. 10108; Silicon Photonics XII; 1010813; Feb. 20, 2017 (9 pages).

\* cited by examiner

GESN NANOBEAM LIGHT-EMITTING DIODE

CROSS REFERENCE TO RELATED APPLICATION

This application claims priority to co-pending U.S. Provisional Application Ser. No. 62/735,994 filed Sep. 25, 2018, entitled "GeSn Nanobeam Light Emitting Diode as a Diode as a GHz-Modulated Light Source," the entire contents of which is incorporated herein by reference.

STATEMENT OF GOVERNMENT INTEREST

The invention described herein may be manufactured and used by or for the Government for governmental purposes.

FIELD OF THE INVENTION

The present invention relates to the field of LEDs and particularly relates to LEDs designed for applications in which light is transmitted by a lightguide, such as light communication circuits.

BACKGROUND OF THE INVENTION

A variety of optical devices, such as communication chips, use laser light sources or bulk vertical LED devices that have various drawbacks. Laser light sources are generally more complicated structures than LEDs and often laser light is not actually required for the application. On the other hand, known bulk LED sources for such applications are larger and less efficient than laser sources. A device is needed that provides an adequate light source for the application but avoids the complication and expense of lasers and avoids the bulk and inefficiencies of bulk LEDs.

SUMMARY OF THE INVENTION

In accordance with one embodiment of the present invention, an LED structure includes a semiconductor base and a nanobeam formed on the base. The nanobeam includes at least three sections, namely, left, right and central nanobeam sections. The central nanobeam section includes a bottom germanium layer formed on the semiconductor base and is doped either negatively or positively. A middle germanium-tin layer is formed on the bottom germanium layer, and a top germanium layer is formed on the middle germanium-tin layer and is doped oppositely from the bottom germanium layer. The left nanobeam section is made of germanium and extends from the left end of the central nanobeam section, while the right nanobeam section is made of germanium and extends from the right end of the central nanobeam section. An electrical circuit is connected between the first and second metal contacts and supplies an electrical signal that energizes the middle section of the nanobeam to emit light and transmit light down the left section of the nanobeam which functions as a lightguide. (The "left" section is used as an arbitrary name, and either end of the central section may be the "left" section. Likewise, the "central" section is used as an arbitrary name and does not mean it must be central to other structure.)

The LED structure may also include a plurality of cylindrical holes extending through the nanobeam and into the semiconductor base. The plurality of holes are arranged in a row along the nanobeam and are sized and spaced apart to form a zero point-defect resonator. In one embodiment, the diameters of the holes may be reduced as the position of the hole moves away from the central section of the nanobeam towards outer ends of the left and right sections of the nanobeam in accordance with a Gaussian taper. The holes nearest the central section of the nanobeam have a diameter of 0.34a and the holes at outer ends of the left and right sections of the nanobeam have a diameter of 0.25a, where a is the lattice constant of the row of holes. The left and right nanobeam sections may have the same lengths and the same number of holes, or may have different lengths and a different number of holes. Where the left and right sections of the nanobeam have a different number of holes, the holes are offset towards the section having the greatest number of holes and the offset is chosen to create the largest cavity quality factor. In one embodiment the LED is configured and dimensioned to have a maximum modulation rate of from about 1.6 GHz to about 0.4 GHz.

The LED structure may include a bottom germanium layer that has a width greater than the middle germanium-tin layer such that the bottom germanium layer extends outwardly from the middle germanium-tin layer and forms two wing extensions, each wing extension extending outwardly and oppositely from the middle germanium-tin layer. Alternately, the germanium layer may include just one wing extension and the second metal contact may be disposed on the wing extension such that it is spaced apart from the middle germanium-tin layer to thereby reduce electrical damping caused by the second metal contact.

In accordance with an alternate embodiment of the present invention, the LED structure may include only one lightguide nanobeam section, such as the left nanobeam section. Otherwise the LED structure may be the same as described above.

(When a value is expressed as "about" a value, it will be understood to specify a plus or minus variance to the value that is reasonable in the particular situation, which will be a 10% variance unless such variance would be known in the art to be unreasonable. Thus, about 1.0 means 0.9 to 1.1 unless such variance would be known to be unreasonable.)

BRIEF DESCRIPTION OF THE DRAWINGS

The present invention may best be understood by reference to an exemplary embodiment described below in conjunction with the Drawings in which:

FIG. 4b is a diagrammatic side view of the LED and nanobeam as shown in FIG. 4a.

DETAILED DESCRIPTION OF THE INVENTION

Instead of the traditional vertical-cavity LED that emits light into free space, the LED described below is integrated into a rib-channel (nanobeam) waveguide in order to radiate the emission into a transparent waveguide (or waveguides)

that are end-coupled to the LED channel. The LED may be an on-chip light source whose "captured emission" drives an on-chip waveguided network. From the standpoint of semiconductor materials, it is necessary for the connecting waveguides to have a wider bandgap than that of the active LED core 43. Hence the connecting waveguide material is different, which may require regrowth of that waveguide material after the LED portions have been formed.

In one embodiment a resonance-enhanced LED structure is formed within a nanobeam (nanobeam). The nanobeam is a rib-channel or strip-channel waveguide that contains a 1D photonic crystal lattice of air holes designed to create a horizontal resonant cavity in mid beam. Resonance refers to the narrowband fundamental (Bloch #1 mode) transmission in the photonic crystal forbidden band. Because the active volume of the LED is then very small, the optical power emitted is likewise small. Therefore, the cavity enhancement necessitates a speed-vs-power tradeoff.

The LEDs may be constructed via group IV photonics (GFP), especially devices that emit at room temperature in the 2 um wavelength band where fiberoptic links are enabled by hollow core PBG fibers. For example, the LED may be a SiGeSn heterostructures. Potential LED applications include sensing and optical interconnects as well as fiber communications. The new 2 micrometer fiber-optic-communication band is an ideal wavelength range in which to apply the LED. For opto-electronic computing applications, 2 micrometer intra-chip and chip-to-chip connects are helpful. In each case, the chip is a monolithic chip containing a complete suite of GFP components.

Figure 1:
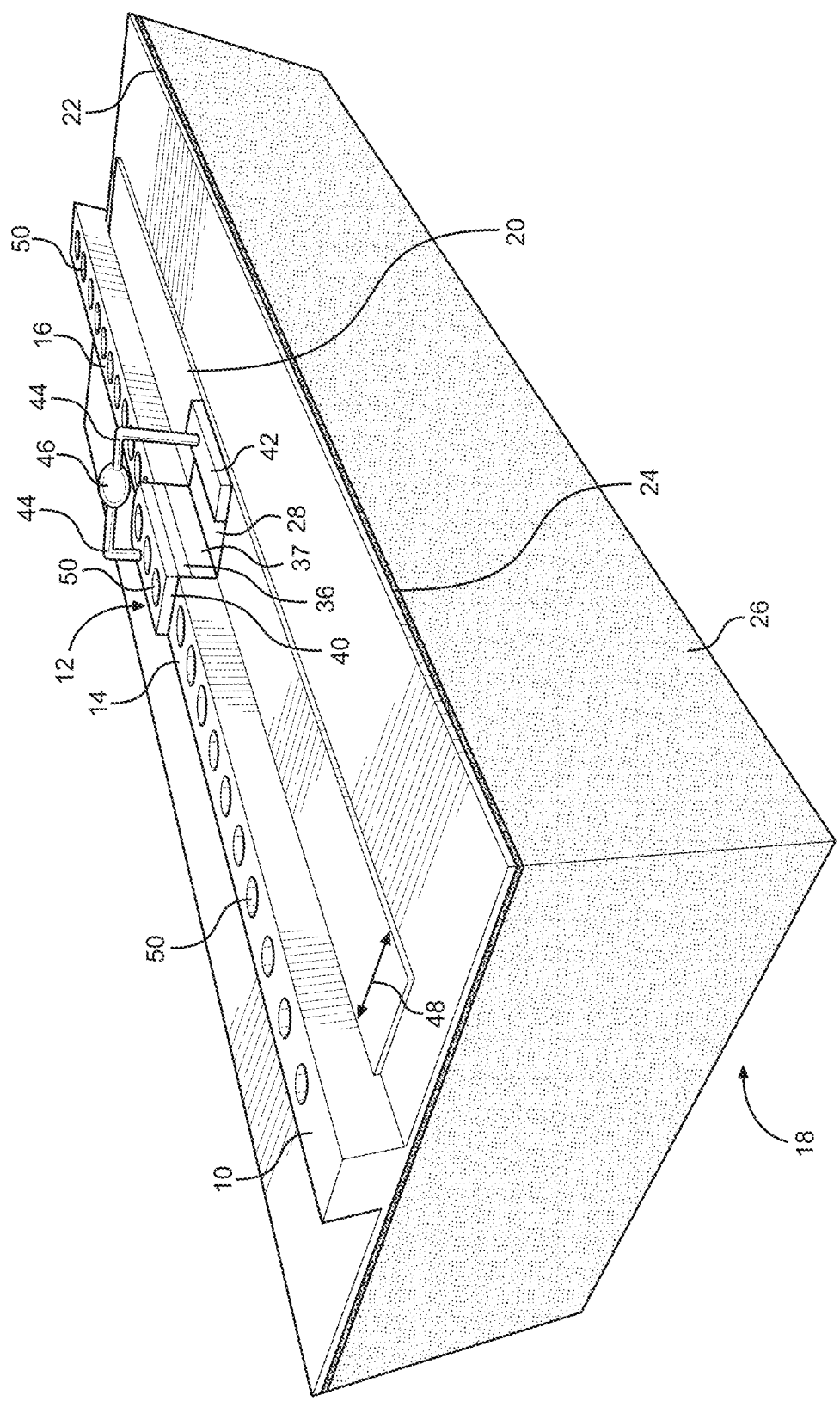
FIG. 1 is a somewhat diagrammatical perspective view of an LED formed in a nanobeam disposed on a semiconductor base.

Referring now to FIG. 1, a perspective view is shown of a nanobeam 10 that includes a nanobeam LED 12 and two output nanobeam waveguides 14 and 16. The nanobeam 10 is disposed on a semiconductor base 18 that includes a relaxed Ge buffer layer 20 (50 nm) on a thin Si layer 22 (50 nm) upon a thick SiO2 layer 24 that rests on a silicon substrate 26. The nanobeam 10 in FIG. 1 acts as one continuous, holey, rib-channel waveguide and yet it consists of three joined sections, namely waveguides 14 and 16 and LED 12. The central section is the electrically pumped P—Ge/i-GeSn/N—Ge emitter, also referred to as the LED 12. The first section, waveguide 14, and the third section, waveguide 16, are undoped Ge rib-channels that end-couple to the three-layer LED 12, an emitter that has very smooth, flat, vertical, etched end-facets. A 50-nm rib platform Ge buffer layer 20 at the bottom of the nanobeam 10 is mostly intrinsic Ge, except in the locally doped central section 28 where it is N—Ge. The length of the central section 28 is typically in the 1.0 to 1.4 um range as defined by the local doping length. Both a top P—Ge layer 36, a middle GeSn layer 37, and the bottom N—Ge rib layer 38 have the same length in the 1.0 to 1.4 um range.

The LED 12 described herein is a technically simpler solution for light sources than complicated structures such as lasers. Not every application demands laser capabilities, and for those applications, the LED 12 is an alternative on-chip source. In the resonant, waveguided GeSn LED 12 described herein, the normal rate of internal EO modulation has been increased dramatically over the rate of prior-art, bulk, free-space LEDs. Our theory work indicates that speeds in the GHz range are feasible. Those speeds result from embedding the active emitter, the LED 12, in a nanobeam-cavity, giving an ultra-small mode volume and high quality factor, leading to a large Purcell factor that reduces the bulk spontaneous recombination time and increases the speed of direct modulation. With the resonator, the LED's broad emission shrinks down to approximately a 1 nm spectral width. Nevertheless, on-chip power is expected to give adequate signal-to-noise ratios at the on-chip photodetectors in various applications. Also, multi-spectral or wavelength-multiplexed LED arrays on-chip appear feasible.

The heterodiode region, the LED 12 in FIG. 1, has two rectangular metal-contacts 40 and 42 that connect to the applied voltage source 44 by wires 46. In one embodiment, the applied voltage source provides an electrical signal that is modulated at a rate of 1.6 GHz or less. The first electrical contact 40 is the metalized exposed top surface of the top P—Ge layer 36, while the second metal contact 42 is on one side of the rib platform Ge layer 20 as shown. The second contact 42 is spaced away from the optical core (the layers 36 and 37 and contact 40) to minimize damping of the optical mode. The rib platform Ge layer 20 extending along the full nanobeam 10 in FIG. 1 provides high Q via optical impedance matching between active and passive sections. As to dimensions, the total nanobeam 10 height is 300 nm, consisting of (50+200+50) nm in the Ge/GeSn/Ge region (layers 36, 37 and 28) where 100 nm of metal (420 nm width) is added locally on top of top P—Ge layer 36 to create the contact 40. The nanobeam LED 12 width is 420 nm. The width of the rib platform Ge layer 20 is 1600 nm, giving a wing extension 48 of 590 nm on each side of the core 43. The second metal contact 42, also 100 nm thick, has a width of 200 nm, leaving a space of 390 nm between metal contact 42 and LED 12 (the optical core). The top metal contact 42 is perforated by photonic crystal air holes 50. As to the doping density, it is $3 \times 10^{17}$ cm$^{-3}$ for P—Ge layer 36 and $4 \times 10^{18}$ cm$^{-3}$ for N—Ge layer 38. The Ge free carrier theory indicates that the extinction coefficient k in each doped layer is 0.0004 at the emission wavelength of 2 micrometers.

Figure 2:
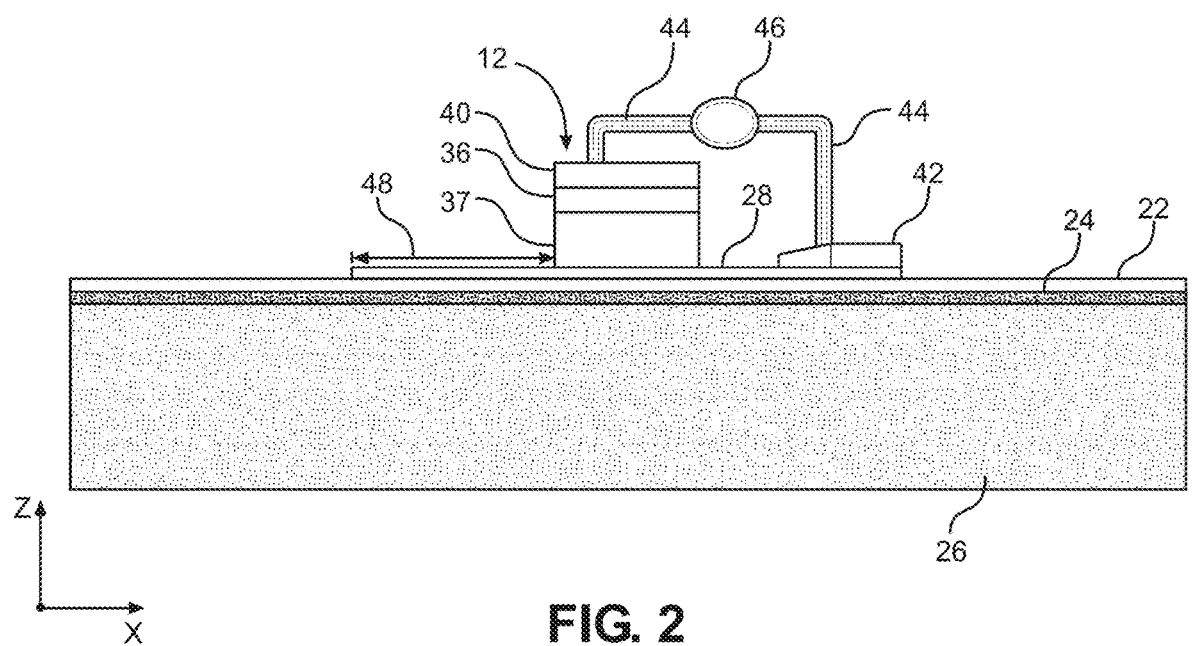
FIG. 2 is a somewhat diagrammatical cross-sectional end view taken through the LED of FIG. 1.
Figure 3:
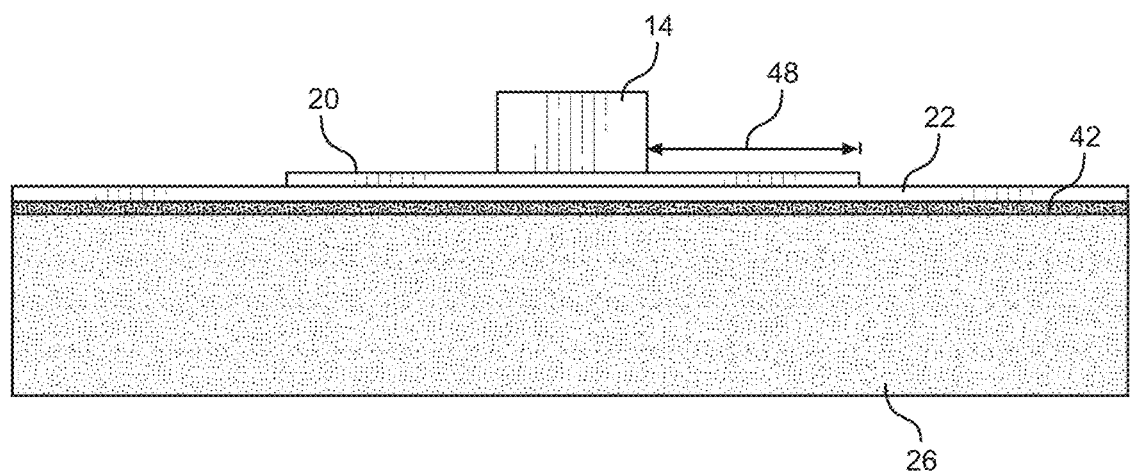
FIG. 3 is a somewhat diagrammatical cross-sectional end view taken through the nanobeam shown in FIG. 1.

For additional clarity, FIG. 2 shows a cross sectional view taken through the LED 12 but not through a hole 50. In this view, it may be appreciated that the P doped central Ge section 28 extends from the metal contact 42, under the middle GeSn layer 37 and to a position on the other side of the LED 12. Thus the LED 12 is formed by the top P—Ge layer 37, the middle GeSn layer 37, and the P—Ge layer 28. FIG. 3 shows a cross sectional view taken through the nanobeam waveguide 14, but not through a hole 50. Thus, it shows the waveguide 13 resting on the Ge layer 20, which is supported by the Si layer 22, the thick SiO2 layer 24, and the silicon substrate 26.

The 1D photonic crystal (the nanobeam 10) consists of a Gaussian taper of cylindrical holes 50 which penetrate through the Ge buffer layer 20 and the Si layer 22 as well as through the waveguides 14 and 16 and the core LED 12. The Gaussian taper allows for high coupling of the emitted light from the active region of the core LED 12 to the Ge ridge waveguides 14 and 16. The lattice constant, a, is 350 nm. The symmetric case, 12/12, signifies twelve air holes on each side of cavity center (the center of LED 12). The Gaussian taper refers to tapering the diameter of those holes from 0.34a in the cavity center to 0.24a at each end of the nanobeam 10, forming a "zero point-defect resonator". The active heterolayer region (the LED 12) is placed in the center between the two tapers where the optical mode field strength is the strongest. The offset of the active heterolayer region (the LED 12) is a/2 (0) for the active region length of L=1 micrometers (1.35 micrometers) discussed below. The offset of the active region was chosen for the largest cavity quality factor. We also examined an asymmetric nanobeam structure known as 24/12. Taking cavity center as a reference line, there are 24 holes in the left-side nanobeam and 12 holes in the right-side nanobeam. For that device the LED 12 is then offset by 5a/2 (2a) towards the 24 hole side for the L=1 micrometers (1.35 micrometers). This is to have the central section LED 12 overlap with the strongest field. The beginning and end photonic crystal hole sizes remain the same size as in the 12/12 design but with the 24-hole tapering being more gradual over twice as many photonic crystal holes.

Performance

Performance of the LED 10 was analyzed by simulation using the following materials and indexes of refractions. A mesh size of 10 nm by 10 nm was used along the width and length of the total nanobeam while the vertical mesh size was 25 nm in the Ge photonic crystal region and 5 nm in the layered active photonic crystal region.

TABLE 1

Refractive index of nanobeam LED materials

| Material n + ik | Index of Refraction |
| --- | --- |
| GeSn | 4.25 |
| Ge | 4.115 |
| Doped Ge | 4.115 + i0.0004 |
| Si | 3.44 |
| SiO$_2$ | 1.44 |
| Au | 0.3003 + i13.4037 |

Figure 4A:
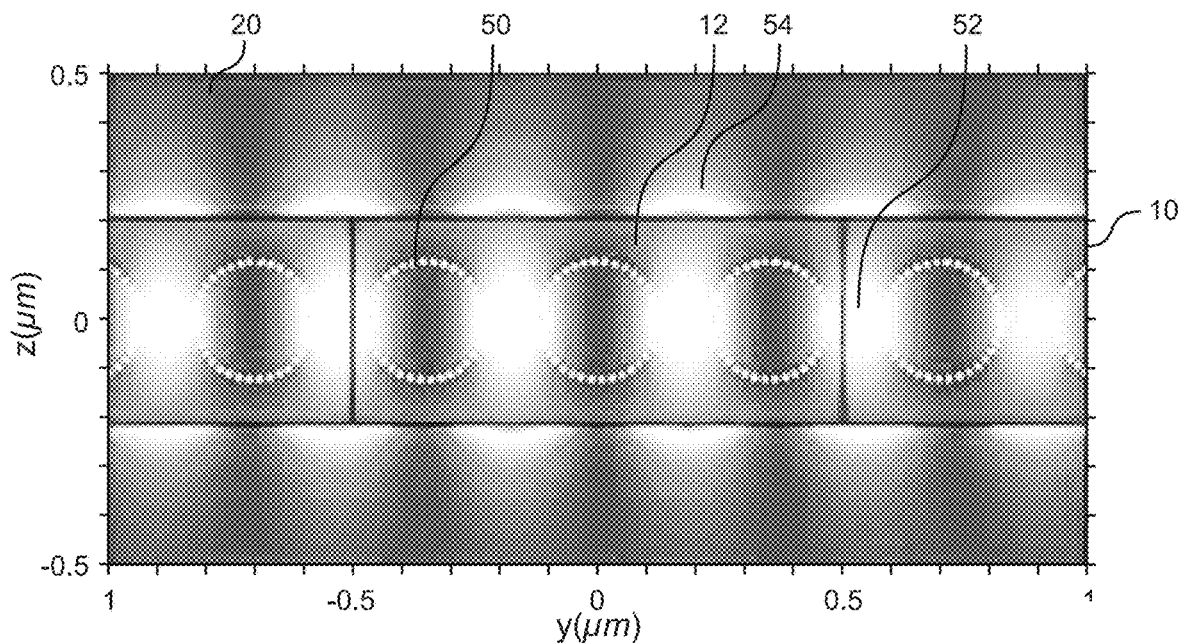
FIG. 4a is a diagrammatic top view of the LED and nanobeam illustrating the structure as partially transparent and showing the light produced by the LED when operating.
Figure 4B:
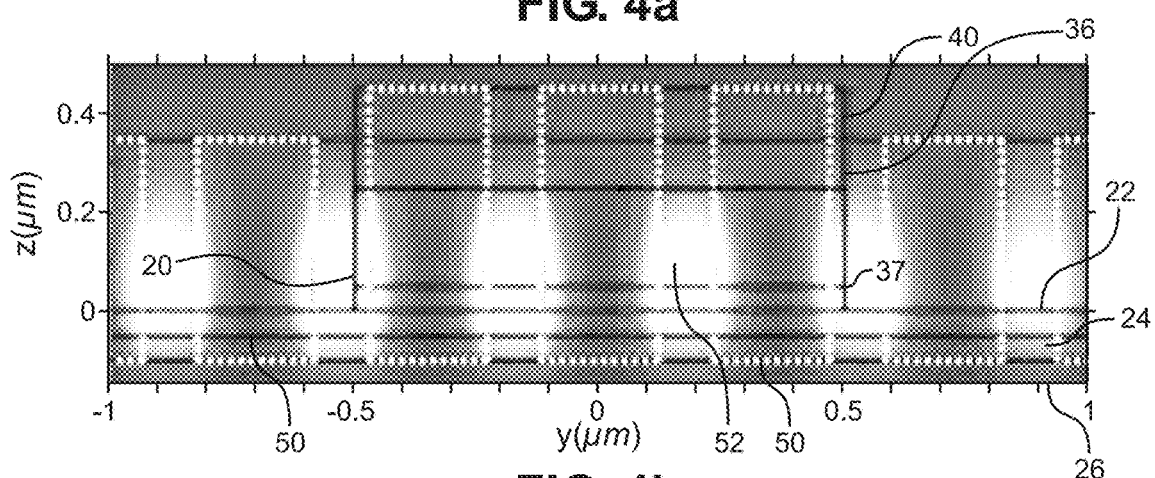
Figure 4C:
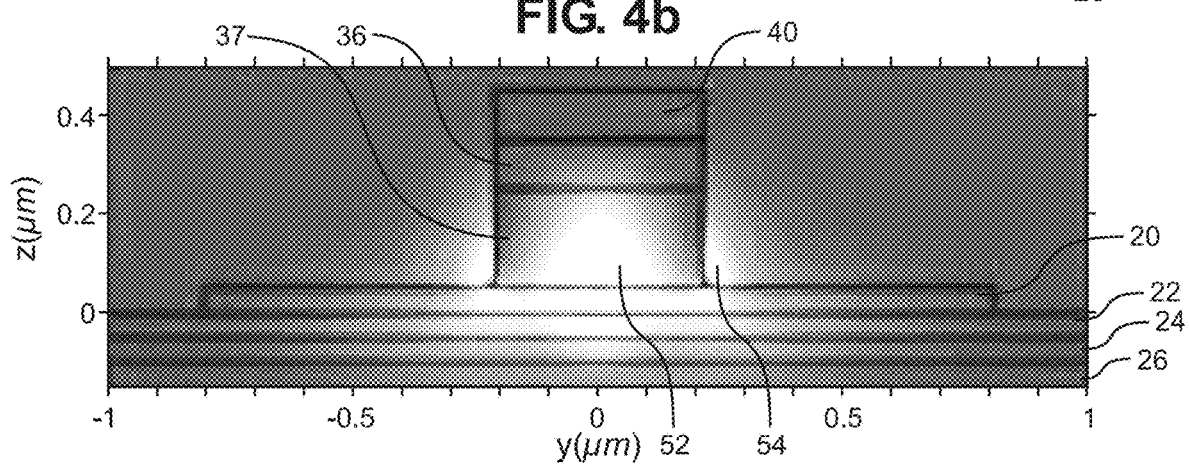
FIG. 4c is a diagrammatic front end view of the LED and nanobeam as shown in FIGS. 4a and 4b.

Referring to FIGS. 4a-4c, somewhat schematic diagrams illustrate light as it would appear in the nanobeam 10 and the LED 12. FIG. 4a is a top view of the nanobeam 10 and LED 12; FIG. 4b is a side view perpendicular to the nanobeam 10, and Fig. c is an end view looking at the end of the nanobeam 10. FIGS. 4a-4c are illustrated as transparent but dark so that the light within may be seen as white and the edges of structure are illustrated by black lines, except for the holes 50, which are illustrated by dotted white lines. For clarity, the holes 50 are not shown in FIG. 4c.

Simulation indicated that for the symmetric cavity (12/12) that top plus side contacts reduced the Q by 33% compared to the top-only case, a result caused by added optical mode tailing into lossy metal.

If we consider all of the space that surrounds the LED segment, a sphere so-to-speak, and if we examine the total infrared emission, our simulations for the 12/12 case reveal that 30% of the total is captured by each of the Ge waveguides 14 and 16 where that light travels along the channel, while the remaining 40% of the total is lost and radiates into the device. In comparison, for the 24/12 case, we find that 49% of the total is confined in the right-side Ge waveguide 16, while 11% of the total travels within the left-side Ge waveguide 14. The remaining 40% goes into the device.

If we assume a spontaneous emission linewidth range from 10 ns to 40 ns as being realistic for these GeSn nanobeam LEDs then calculations predict an on-chip modulation speed in the range from about 1.6 GHz (actually calculated to be 1.59 GHz) down to about 0.4 GHz (actually calculated to 0.40 GHz) for the 12/12 symmetric nanobeam device. For the asymmetric 12/24 device calculations predict max modulation speed to range from about 1.3 GHz (actually calculated to 1.26 GHz) to about 0.3 GHz (actually calculated to 0.32 GHz). If the spontaneous emission linewidth is assumed to be 100 ns, the modulation speeds are 40% higher. From these calculations is appears that modulation speeds will be sufficient for a variety of applications including communication applications.

A group IV photonics platform for a high modulation-rate PIN heterostructure LED based on bulk GeSn emission has been studied theoretically. Emission of bulk GeSn is coupled into Ge waveguides which also provide the platform for a photonic crystal nanobeam structure. The resonant structure enhances the modulation speed at which the LED can perform compared to traditional bulk LEDs while allowing for integration on a PIC with the 2 micrometer communication band. It has been shown that operation up to 1.6 GHz is feasible and that directional infrared emission into a single waveguide is achievable with an asymmetric photonic crystal nanobeam at the cost of a slightly lower modulation rate.

The invention claimed is:

1. An LED structure comprising:
   a thick Si substrate having a thickness of greater than 50 nm and less than 1000 nm;
   a thin Si layer having a thickness of about 50 nm formed on the thick silicon substrate;
   a relaxed Ge buffer layer having a thickness of about 50 nm formed on the thin Si layer;
   a nanobeam formed on the Ge buffer layer having a left nanobeam section, a central nanobeam section and a right nanobeam section;
   the central nanobeam section including:
   1) a bottom germanium rib layer having a length of about 1.0 to 1.4 micrometers a thickness of about 50 nanometers and a width of about 1600 nanometers formed on the relaxed germanium buffer layer and being N doped,
   2) a middle germanium-tin layer having a length of about 1.0 to 1.4 micrometers, a thickness of about 200 nm having a width of about 420 nm formed on the bottom germanium rib layer, the middle germanium-tin layer being formed in the mid-region of the bottom germanium rib layer such that the bottom germanium rib layer includes wing extensions extending outwardly from either side of the middle germanium-tin layer, the wing extensions having a width of about 590 nm on each side of the middle germanium-tin layer,
   3) a top germanium layer having a length of about 1.0 to 1.4 micrometers, a thickness of about 50 nm and a width of about 420 nm formed on the middle germanium-tin layer and being P doped;
   4) a first metal contact having a length of about 100 nm, a width of about 420 nm and a thickness of about 100 nm and being formed on the top germanium layer, and
   5) a second metal contact having a length of about 100 nm, a width of 200 nm and thickness of about 100 nm, and being formed on the wing extension of the N doped bottom germanium rib layer and being spaced apart from the middle germanium-tin layer by a distance of about 390 nanometers;
   the left nanobeam section including:
   1) a left germanium rib layer having a length of about 4.0 micrometers, a thickness of about 50 nanometers and a width of about 1600 nanometers formed on the relaxed germanium buffer layer, the left germanium rib layer extending from the bottom germanium rib layer, and
   2) a left germanium nanobeam having a length of about 4.0 micrometers, a thickness of about 250 nm and a width of about 420 nm, the left germanium nanobeam extending from the middle germanium-tin layer and the top germanium layer;
   the right nanobeam section including:
   1) a right germanium rib layer having a length of about 4.0 micrometers, a thickness of about 50 nanometers and a width of about 1600 nanometers formed on the relaxed germanium buffer layer, the left germanium rib layer extending from the bottom germanium rib layer, and 2) a right germanium nanobeam having a length of about 4.0 micrometers, a thickness of about 250 nm and a width of about 420 nm, the right germanium nanobeam extending from the middle germanium-tin layer and the top germanium layer;

a plurality of cylindrical holes extending through the first metal contact, the nanobeam, the relaxed Ge buffer layer, and the thin Si layer and into the thick Si substrate, the plurality of holes being arranged in a row along the nanobeam and being sized and spaced apart to form a zero point-defect resonator, the diameters of the holes being reduced as the position of the hole moves away from the center of the nanobeam towards the ends of the left and right sections of the nanobeam in accordance with a Gaussian taper with the holes nearest the center of the nanobeam having a diameter of 0.34a and the holes at the end of the left and right sections of the nanobeam having a diameter of 0.25a, where a is the lattice constant and is about 350 nanometers; and an electrical circuit connected between the first and second metal contacts to supply an electrical signal that energizes the middle section of the nanobeam to emit light as a light emitting diode and transmit light down both the left and right sections of the nanobeam which functions as a resonance enhanced lightguide.

* * * * *